United States Patent [19]
Goukura et al.

[11] Patent Number: 5,243,412
[45] Date of Patent: Sep. 7, 1993

[54] CIRCUIT FOR GENERATING A CLOCK SIGNAL WHICH IS LOCKED TO A SPECIFIC PHASE OF A COLOR BURST SIGNAL IN A COLOR VIDEO SIGNAL

[75] Inventors: Akira Goukura; Hideotoshi Ozaki, both of Yokohama, Japan

[73] Assignee: Victor Company of Japan, Ltd., Yokohama, Japan

[21] Appl. No.: 743,007

[22] Filed: Aug. 9, 1991

[30] Foreign Application Priority Data

Aug. 9, 1990 [JP] Japan .................. 2-212652
Aug. 9, 1990 [JP] Japan .................. 2-212653
Aug. 17, 1990 [JP] Japan .................. 2-217915

[51] Int. Cl.$^5$ .............................................. H04N 9/66
[52] U.S. Cl. ....................................... 358/19; 358/20
[58] Field of Search .................. 358/13, 17, 19, 25, 358/28, 21 R, 23

[56] References Cited

U.S. PATENT DOCUMENTS

| 4,291,332 | 9/1981 | Kato et al. | 358/19 |
| 4,527,145 | 7/1985 | Haussmann et al. | 358/19 |

FOREIGN PATENT DOCUMENTS

| 202015 | 11/1986 | European Pat. Off. . | |
| 331016 | 9/1989 | European Pat. Off. . | |
| 0025524 | 2/1977 | Japan | 358/19 |
| 0100789 | 7/1980 | Japan | 358/13 |
| 0080385 | 5/1985 | Japan | 358/20 |
| 0157095 | 7/1986 | Japan . | |
| 0152297 | 1/1988 | Japan . | |

OTHER PUBLICATIONS

Jul., 1988 edition of the magazine "Electronics" published in Japan, pp. 47–53.

Primary Examiner—James J. Groody
Assistant Examiner—David E. Harvey
Attorney, Agent, or Firm—Lowe, Price, LeBlanc & Becker

[57] ABSTRACT

A sampling clock signal, which determines sampling time points in an A/D converter used to convert a color video signal to digital form, is locked to a specific predetermined phase of the color burst signal of the video signal, by a negative feedback loop formed of a circuit for deriving successive color burst phase values from the digital color signal values, a gate circuit and a subtractor for obtaining the difference between color burst phase and a reference phase value, for one specific A/D conversion sampling time point in each horizontal scanning interval, and circuits for producing the sampling clock signal and controlling the phase of that signal in accordance with the phase difference values.

3 Claims, 12 Drawing Sheets

CIRCUIT FOR GENERATING A CLOCK SIGNAL WHICH IS LOCKED TO A SPECIFIC PHASE OF A COLOR BURST SIGNAL IN A COLOR VIDEO SIGNAL

BACKGROUND OF THE INVENTION

1. Field of the Invention

The present invention relates to a circuit for generating a clock signal which determines time points at which a color video signal is periodically sampled to be converted from analog to digital form by a digital-to-analog converter. More specifically, the invention relates to a circuit for generating such a clock signal, which is locked to a specific predetermined phase of the color burst signal component of the color video signal.

2. Description of the Related Art

Digital VTRs (video tape recorders) are coming into increasing use, in a variety of fields of application. Generally speaking, in the case of digital VTRs used in industrial applications, the composite color video signal is directly converted from analog to digital form prior to recording, without separating the luminance and chrominance components of the video signal for separate processing. In addition, to maximize the efficiency of utilization of recording tape, the horizontal and vertical blanking intervals (together with the synchronizing signals and color burst signal contained in these) are eliminated prior to recording the digital color video signal. In a color video signal, the chrominance signal is formed by combining two independently modulated signals (I and Q signals) each having an identical subcarrier frequency (i.e. 3.58 MHz, in the case of the NTSC television standard) and differing in phase by 90°. Once in each horizontal scanning interval of a composite color video signal, a color burst signal occurs shortly after the horizontal synchronizing pulse (having a phase that differs from the I and Q phase values by fixed amounts) within the horizontal blanking interval. A television receiver which receives that color video signal (or receives a playback color video signal from a video tape recorder) contains an automatic phase and frequency control circuit which generates a reference chrominance subcarrier signal that is phase-locked to the color burst signal, and the chrominance signal is demodulated by using that reference chrominance subcarrier signal.

However in the case of an industrial-use type of digital VTR, in which the horizontal blanking intervals of the color video signal have been eliminated prior to recording, there will be no color burst signal present in the playback digital color video signal, for use in generating a local reference chrominance subcarrier for demodulating the chrominance signal. That problem is overcome by establishing a fixed relationship between the phase of the sampling time points used in the analog-to-digital conversion processing by which the analog color video signal is converted to a digital signal prior to recording, and a specific phase of the color burst signal. A local reference chrominance subcarrier can thereby be generated at the time of playback, based on the phase of the sampling time points, which can be derived from the playback digital color video signal.

Since the frequency of a sampling clock signal which determines the sampling time points used in analog-to-digital conversion will of course be equal to the chrominance subcarrier frequency multiplied by a factor that is greater than one, the term "fixed relationship to a specific phase of the color burst signal" or "locked to a specific phase of the color burst signal" signifies, assuming that the sampling frequency is four times the chrominance subcarrier frequency, that for example the sampling time points will respectively coincide with the 0°, 90°, 180°, and 270° phase values of the color burst signal. Alternatively, with thae standard that is specified for D-2 format industrial-use digital VTRs, these sampling time points will be locked in phase to the I and Q components of the chrominance signal.

In order to accurately demodulate the chrominance signal by such a method, it is necessary to maintain a high degree of accuracy for the phase lock relationship between the analog-to-digital conversion sampling phase and color burst signal phase, i.e. the analog-to-digital conversion clock signal phase must be held accurately locked to within less than 2° of error.

FIG. 1 is a a block diagram showing the basic configuration of a prior art circuit for executing analog-to-digital conversion using a sampling clock signal that is locked to a specific phase of a color video signal. In FIG. 3, numeral 1 denotes an input terminal to which is applied the color video signal that is to be subjected to analog-to-digital conversion, 2 denotes a digital data output terminal, 3 denotes an amplifier, 4 denotes an A/D converter, 5 denotes a color burst signal detection circuit, 6 denotes an adjustable phase shift circuit, 6a denotes a phase shift amount variation device such as a variable resistor, which is manually operable to alter an amount of phase shift that is produced by the adjustable phase shift circuit 6, and 7 denotes a phase locked loop (hereinafter referred to as a PLL). The analog color video signal that is supplied to the input terminal 1 is amplified by the amplifier 3 and then supplied to the A/D converter 4 and also to the color burst detection circuit 5. The color burst detection circuit extracts the color burst signal which is present in the back porch portion of each horizontal blanking flyback interval of the color video signal, i.e. once in each horizontal scanning line of that signal. The separated color burst signal is supplied to the phase adjustment circuit 6. At the time of manufacture, the amount of phase shift that is applied to the separated color burst signal by the phase adjustment circuit 6 is adjusted by an arbitrary amount, through manual adjustment by an operator of the variation device 6a. The phase-shifted color burst signal is then supplied to the PLL 7, which produces an output signal which is locked in phase with that color burst signal and is higher in frequency, and which serves as the sampling clock signal of the A/D converter 4. A predetermined phase relationship can thereby be established between that sampling clock signal and the color burst signal within the color video signal that is converted to digital form by the A/D converter 4. To establish that predetermined phase relationship, it is necessary for the operator to adjust the device 6a while continuously observing a measurement apparatus (not shown in the drawing) that is coupled to the circuit shown in FIG. 1, and which enables the operator to ascertain when the predetermined phase relationship has been reached.

However with the such a prior art circuit for generating a clock signal which is locked to a specific phase of a color burst signal, since the phase adjustment must be carried out by manually executed operations, the adjustment process is time-consuming and will result in increased manufacturing cost, while the accuracy of phase adjustment may not be satisfactory. In addition, even if such a phase adjustment operation were to be automated at the stage of manufacture of digital VTRs, it may be subsequently necessary to readjust the phase relationship after a length of time has elapsed, since the phase of the sampling clock signal will be affected by changes which occur with time in the elements of the adjustment circuit and in peripheral circuits. For example the phase will be affected by variations in respective amounts of delay produced by circuit components which are positioned before or after the A/D converter, such as a low-pass filter, AGC circuit, clamp circuit, etc, or changes in delay produced within the A/D converter 4 itself.

For these reasons, it has not been possible in the prior art to provide a circuit for generating a clock signal for use in analog-to-digital conversion of a color video signal, which is locked to a specific phase of a color burst signal, and which will be free from the need to execute phase adjustments.

SUMMARY OF THE INVENTION

It is an objective of the present invention to overcome the disadvantages of the prior art as set out above, by providing a circuit for generating a clock signal which is locked to a specific predetermined phase of a color burst signal. A sampling clock signal which is used in analog-to-digital conversion of a color video signal to digital form can thereby be held automatically locked to a predetermined phase of a color burst signal of that color video signal. The need for executing adjustments of a circuit which produces the sampling clock signal is thereby eliminated.

The above objective is basically achieved by forming an automatic phase control circuit as a negative feedback loop, which is supplied with a fixedly preset numeric value representing a specific phase value of the color burst signal (i.e. of the chrominance subcarrier), derives a phase error amount as a difference between that preset phase value and a detected phase value of the color burst signal of the input color video signal, during a specific interval once in each horizontal scanning interval, and controls the phase of the sampling clock signal such as to reduce that phase error amount to zero. The aforementioned specific interval is an interval, occurring once in each horizontal scanning interval of the video signal, during which is obtained a detected value of the phase of the color burst signal corresponding to one specific converted digital value, i.e. the phase of the color burst signal at one predetermined sampling time point.

More specifically, according to a first aspect, the present invention provides a circuit for generating a sampling clock signal for use in converting an analog color video signal having a color burst signal contained in a horizontal blanking interval of each horizontal scanning interval thereof to a digital color video signal, said sampling clock signal being locked to a predetermined phase of said color burst signal, comprising:

phase detection means coupled to receive said color video signal, for producing successive data values of phase of said color burst signal in respective correspondence with periods of said sampling clock signal;

gating signal generating means for generating a gating signal that is synchronized with a specific one of said phase data values, once in each of said horizontal scanning intervals;

gate circuit means coupled to receive said phase data values from said phase detection means, and responsive to said gating signal for selecting and outputting said specific one of the phase data values, once in each of said horizontal scanning intervals;

phase value setting means for outputting a predetermined phase data value;

subtractor means for deriving successive phase difference data values, each being a difference between said predetermined phase data value and one of said selected phase data values; and sampling clock signal generating means for generating said sampling clock signal and for executing phase control of said sampling clock signal in accordance with said phase difference data values.

According to a second aspect, said gating signal generating circuit means comprises counter circuit means for counting a predetermined number of periods of said sampling clock signal in each of said horizontal scanning intervals, beginning from a reference time point within said horizontal scanning interval, and for producing said gating signal when said predetermined number is reached.

According to a third aspect, such a circuit further includes synchronizing signal separator circuit means for extracting a horizontal synchronizing signal from said color video signal in each of said horizontal scanning intervals, with a leading or trailing portion of said horizontal synchronizing signal being used to establish said reference time point.

According to a fourth aspect, the sampling clock signal generating means of such a circuit comprises:

a numerical control oscillator for producing an output signal consisting of successive digital data values which vary periodically in magnitude, responsive to said phase difference data values from said subtractor means for executing phase control of said output signal;

digital-to-analog conversion means for converting said digital data values from said numerical control oscillator to respective analog values, to produce a periodically varying analog signal; and a phase-locked loop circuit for producing as said sampling clock signal an output signal having a frequency which is n times that of said color burst signal, wherein said sampling clock signal frequency is m/n times that of said periodically varying analog signal, where m and n are respective positive non-zero integers, and wherein said sampling clock signal is locked in phase with said periodically varying analog signal.

According to a fifth aspect, the sampling clock signal generating means of such a circuit comprises:

digital-to-analog conversion means for converting said phase difference data values from said subtractor means to respective analog values;

amplifier and low-pass filter means for amplifying and filtering said analog values to obtain a control voltage signal; and a voltage controlled oscillator for producing said sampling clock signal as an output signal, and for executing phase control of said sampling clock signal in accordance with control voltage signal.

According to a sixth aspect, such a circuit further includes phase difference conversion circuit means coupled to receive said phase difference data values produced from said subtractor means, wherein designating a phase difference data value produced from said subtractor means as $(\phi_o - \phi)$ where $\phi$ is a phase value produced from said phase detection circuit means and $\phi_o$ is said predetermined phase value, said phase difference data value is converted to an output phase difference data value which is expressed in units of degrees as:

$$(360 k/n + \phi_o + 180) - \phi$$

where k is one of a set of positive integers 0, 1, ... n, and wherein said output phase difference data value is inputted to said sampling clock signal generating means.

According to a seventh aspect, said phase value setting means comprise a first setting circuit having preset therein a first predetermined phase value, and a second setting circuit having preset therein a second predetermined phase value which differs from said first predetermined phase value by 180°, said sampling clock signal generating circuit further comprising:

color frame detection circuit means for deriving, for each field of said color video signal, phase alternation information indicating a specific sequence whereby the phase of said color burst signal is alternately in a non-inverted and inverted state in successive horizontal scanning intervals during said field;

switching signal generating circuit means for generating a switching signal in accordance with said phase alternation information; and changeover switch means responsive to said switching signals for alternately supplying said first and second predetermined phase values as subtrahend input data of said subtractor means, in accordance with said specific sequence.

DESCRIPTION OF PREFERRED EMBODIMENTS

Figure 1:
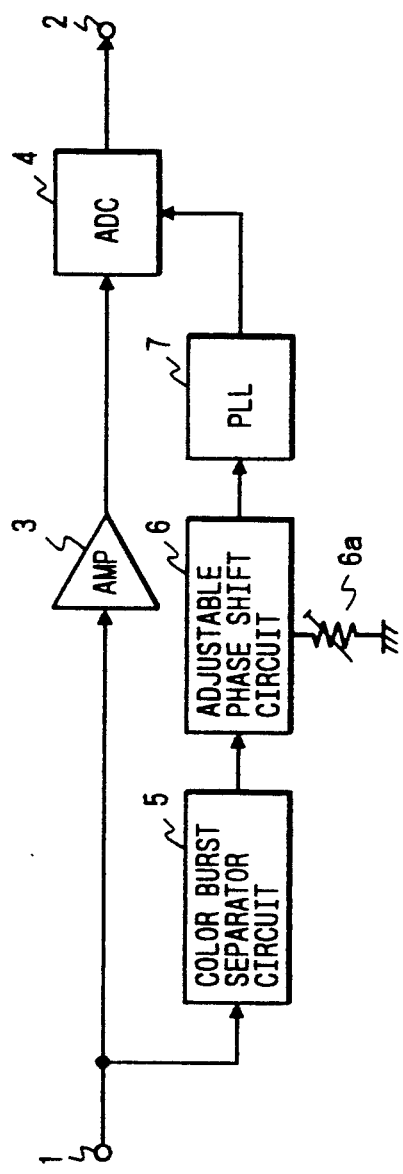
FIG. 1 is a general circuit block diagram of an example of a prior art circuit for generating a clock signal which is locked to a specific phase of a color burst signal.
Figure 2:
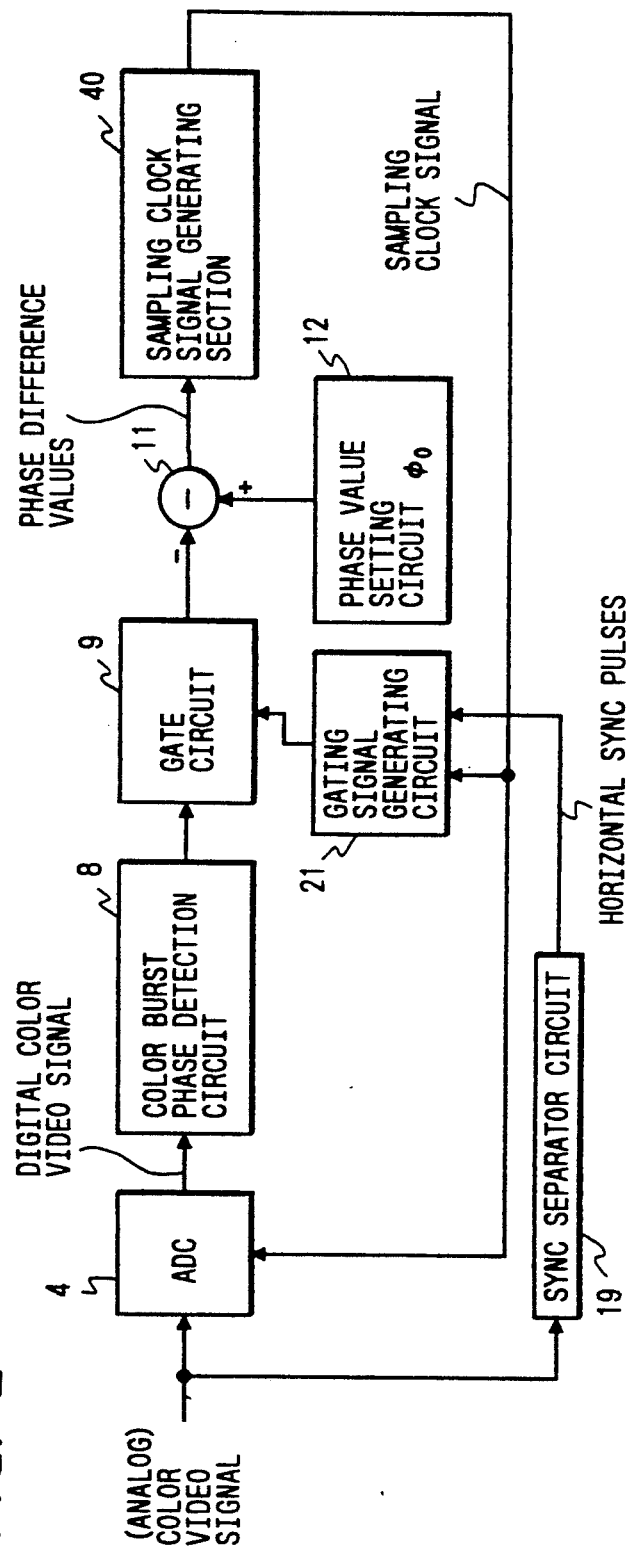
FIG. 2 is a circuit block diagram for assistance in describing the basic operation of the present invention.
Figure 3:
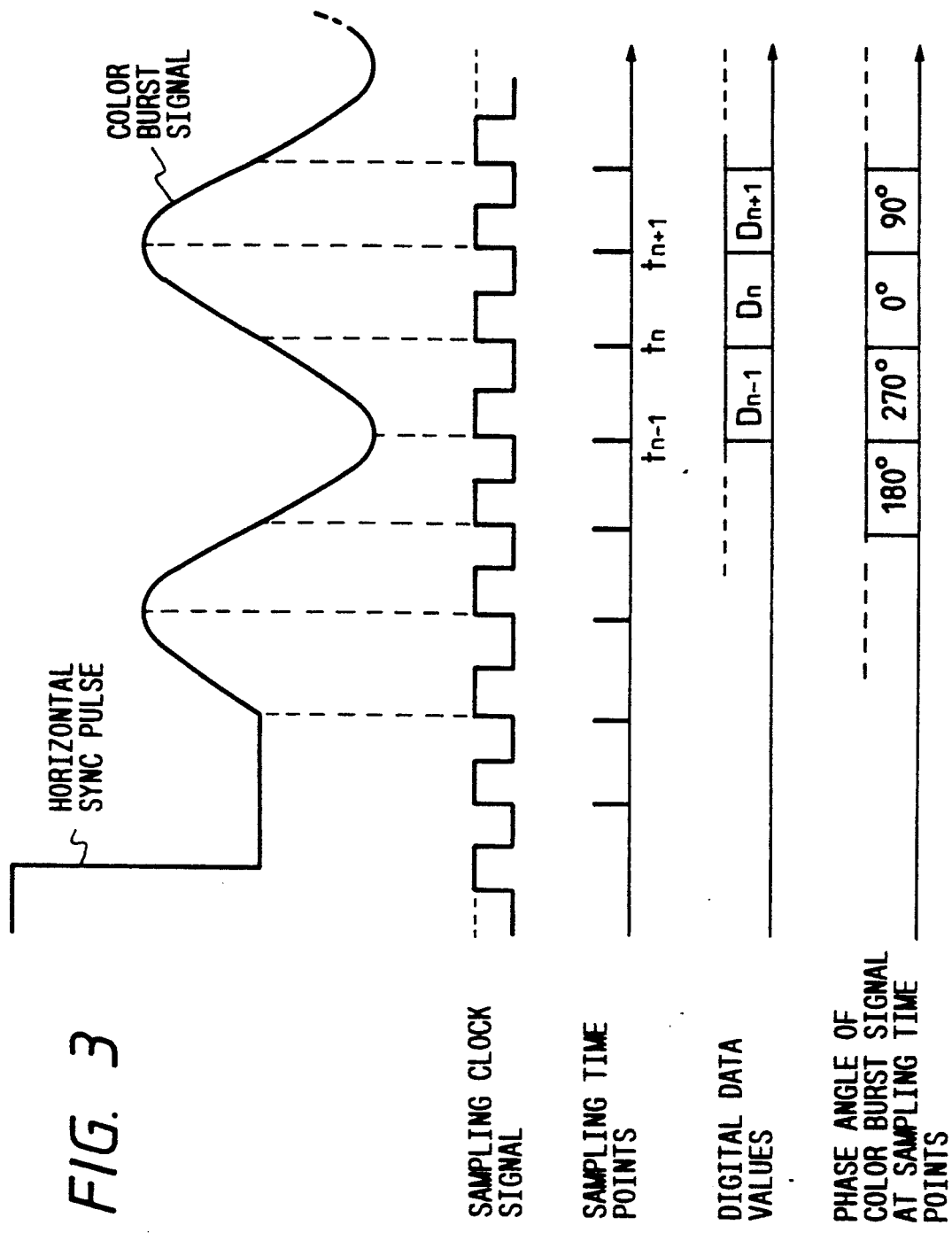
FIG. 3 is a timing diagram for assistance in describing the basic operation of the present invention.

The basic operation of a circuit according to the present invention for generating a clock signal which is locked to a specific phase of a color burst signal will be described referring to the general circuit block diagram of FIG. 2. It should be noted that the terms frequency and phase of the color burst signal, as used herein, signify respective values of these within each burst of that signal, which are respectively identical to the frequency and phase of the chrominance subcarrier. In FIG. 2, an analog color video signal is supplied to a A/D converter 4, to be periodically sampled and quantized, to obtain successive digital values. The digital color video signal that is thereby outputted from the A/D converter 4 is supplied to a color burst signal phase detection circuit 8 in which, during each color burst signal portion which occurs during a "back porch" portion of the horizontal blanking interval in each horizontal scanning interval of the color video signal, a corresponding value of phase angle of the color burst signal is derived in correspondence with each of the digital values of the digital color video signal. That operation is illustrated in the timing diagram of FIG. 3 in which it is assumed that the sampling clock signal (which is supplied to the A/D converter 4 for determining successive sampling time points) has a frequency that is four times the frequency of the color burst signal. As shown, at each of the sampling time points $t_{n-1}, t_n, t_{n+1}, \ldots$, a corresponding digital data value of the color video signal is derived, i.e. as $D_{n-1}, D_n, D_{n+1}, \ldots$. In this example, respective sampling time points coincide with the 0°, 90°, and 270° phase angles of the color burst signal as illustrated. In addition, the phase angle of the color burst signal at the sampling time point $t_n$ is 0°. The basic feature of the present invention is that such a phase relationship is fixedly maintained by negative feedback control. This is done by selecting, during each color burst signal portion at the end of a each horizontal scanning interval (from the successive phase values that are outputted from the color burst signal phase detection circuit 8) a single specific phase value which corresponds to one specific sampling time point within that color burst signal portion. It will be assumed for example that the phase value of 0°, corresponding to the sampling time point $t_n$, has been established as the value that will be selected by the gate circuit 9 once in each color burst signal portion. The time-axis position of that sampling time point $t_n$ within a horizontal scanning interval (and hence the time at which the corresponding value of color burst signal phase angle is derived) will of course vary in accordance with changes in phase of the sampling clock signal, which is produced by a sampling clock signal generating section 40. For that reason, the point at which that specific sampling time point occurs is preferably determined by counting a corresponding specific number of periods of the sampling clock signal which occur following a predetermined reference point within each horizontal scanning interval. That reference time point can conveniently be the leading edge of the horizontal synchronizing pulse, in which case as shown in FIG. 2, the horizontal synchronizing pulses are separated from the color video signal by the synchronizing signal separator circuit 19, and supplied to the gating signal generating circuit 21 for use in establishing these reference time points. In this way the gating signal generating circuit 21 is configured to generate a gating signal once in each horizontal scanning interval, coinciding with the time interval during which the phase value corresponding to the $t_n$ sampling time point is being outputted from the color burst signal phase detection circuit 8.

A phase value setting circuit 12 has set therein a predetermined phase value (i.e. which could be, in the case of the above example, a numeric value representing 0°) which is supplied as the minuend (+) data input of a subtractor 11, while the selected value of color burst signal phase angle is applied to the subtrahend (−) input of the subtractor 11. A phase difference data value is thereby outputted from the subtractor 11 once in each horizontal scanning interval, and is supplied to the sampling clock signal generating section 40. The sampling clock signal generating section 40 is configured to generate the sampling clock signal at the chrominance subcarrier frequency, with the phase being controlled in accordance with the successive values of phase difference supplied from the subtractor 11.

In this way, a negative feedback loop constituting an automatic phase control circuit is formed, in which the error quantity consists of successive phase difference values produced from the subtractor 11, the reference quantity is the value that has been preset into the input terminal 1, and the controlled quantity is the phase of the sampling clock signal.

Figure 4:
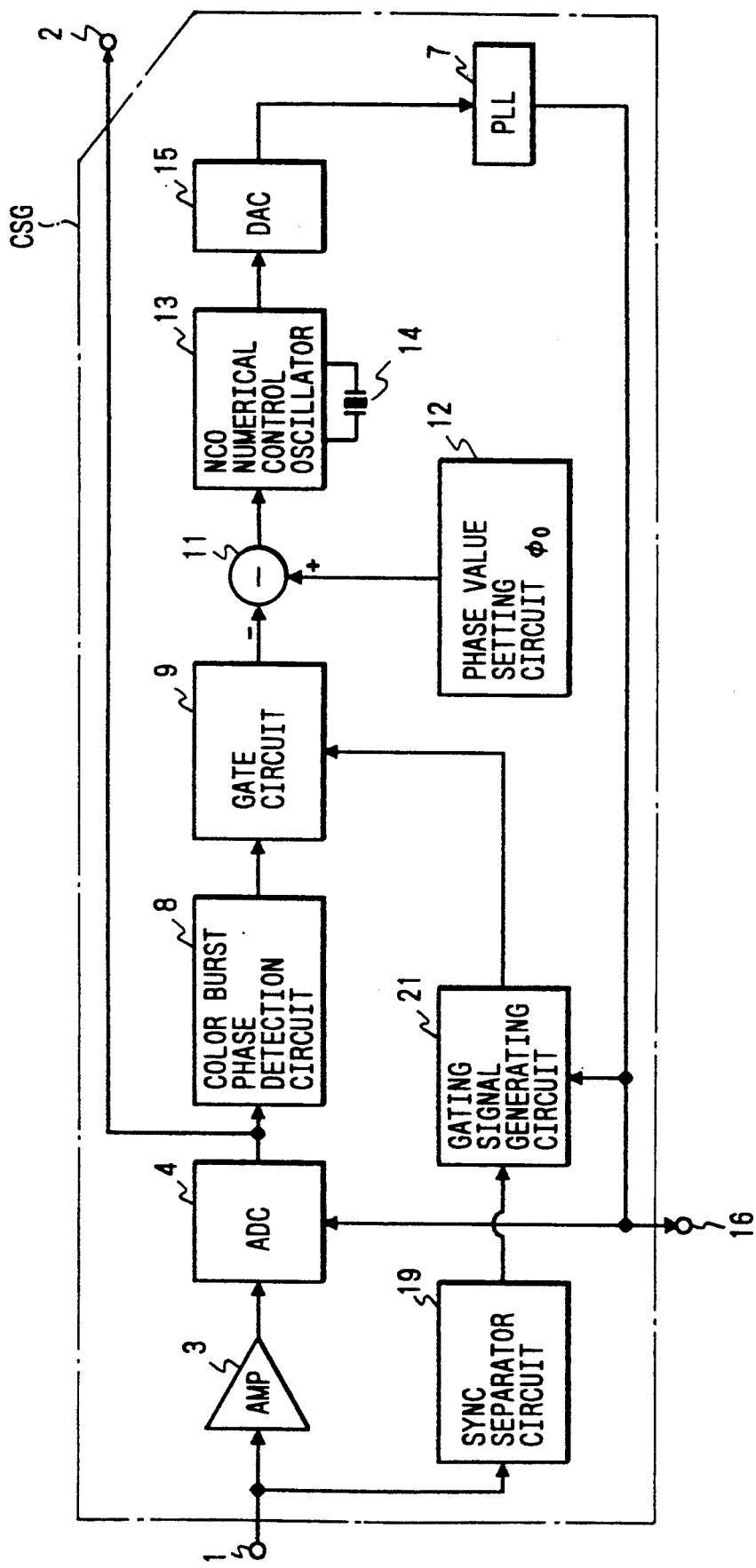
FIG. 4 is a general circuit block diagram of a first embodiment of a circuit according to the present invention for generating a clock signal which is locked to a specific phase of a color burst signal.

A first embodiment of a circuit according to the present invention for generating a clock signal which is locked to a specific phase of a color burst signal will be described, referring to the general circuit block diagram of FIG. 4. Blocks which corresponds to circuit blocks in FIG. 2 described above are designated as in FIG. 2, and detailed description of these will be omitted. In FIG. 4, numeral I denotes an input terminal to which is supplied the (analog) color video signal which is to be subjected to analog-to-digital conversion, and 2 denotes an output terminal from which the digital color video signal from the A/D converter 4 is outputted to other circuits. Numeral 16 denotes an output terminal from which the sampling clock signal is outputted to other circuits, such as a chrominance demodulator circuit. A predetermined phase value of has been set into the phase value setting circuit 12. Numeral 13 denotes an numerical control oscillator. As used herein, the term "numerical control oscillator" signifies a circuit which produces an output signal consisting of cyclically varying digital data values, with the phase of that output signal being controllable in accordance with a digital data value that is applied as an input control value. The resolution of the numerical control oscillator 13 (i.e. the number of successive digital data values that are outputted from the numerical control oscillator 13 during one period of the aforementioned cyclic variation) is determined in this embodiment by a clock signal produced by a quartz crystal oscillator circuit whose frequency is controlled by a quartz crystal vibrator 14, as described in detail hereinafter with reference to a specific circuit configuration for the numerical control oscillator 13.

Numeral 15 denotes a digital-to-analog converter, which converts the successive data values produced from the numerical control oscillator 13 to analog form, to thereby obtain a periodically varying analog signal, which is supplied as a phase control input signal to a phase locked loop (hereinafter abbreviated to PLL) 7. The PLL 7 produces, as the sampling clock signal which is supplied to the A/D converter 4, a signal which is phase locked to the output signal from the D/A converter 15 and whose frequency is equal to that of the output signal from the D/A converter 15 multiplied by a factor m/n, where m and n are non-zero positive integers and m is greater than n. The frequency of the sampling clock signal is n times that of the chrominance subcarrier, designated in the following as $f_{sc}$, so that the frequency of the output digital signal from the numerical control oscillator 13 is 1/m times that of the sampling clock signal.

It can be understood that the combination of circuit blocks 13, 15 and 7 correspond to the sampling clock signal generating section 40 of FIG. 2, i.e. an automatic phase control circuit is formed as a negative feedback loop, for controlling the phase of the sampling clock signal in accordance with the phase difference values that are derived by the subtractor 11, with the feedback loop path being: A/D converter 4—color burst detection circuit 8—gate circuit 9—subtractor 11—numerical control oscillator 13—D/A converter 15—PLL 7—A/D converter 4. That feedback loop executes automatic phase control by reducing to zero the phase difference that is obtained by the subtractor 11 within the feedback loop, with respect to the preset phase data from the phase data setting section 12. The sampling clock signal that is supplied to the A/D converter 4 is thereby held locked to the phase that has been set in the phase data setting section 12, i.e. a specific phase of the color burst signal (and hence of the chrominance subcarrier).

Figure 5A:
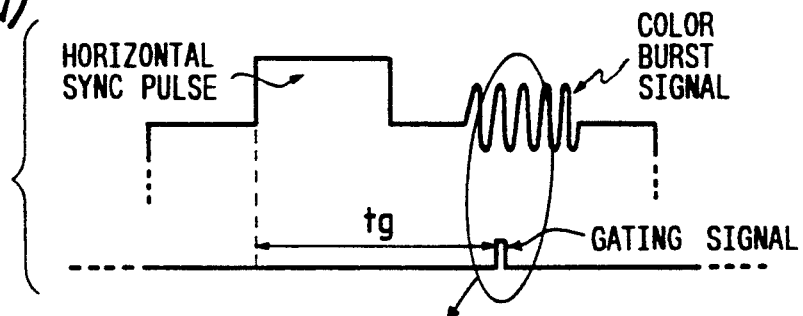
FIGS. 5(a)-(c) are timing diagram for assistance in describing the operation of the embodiment of FIG. 4.
Figure 5B:
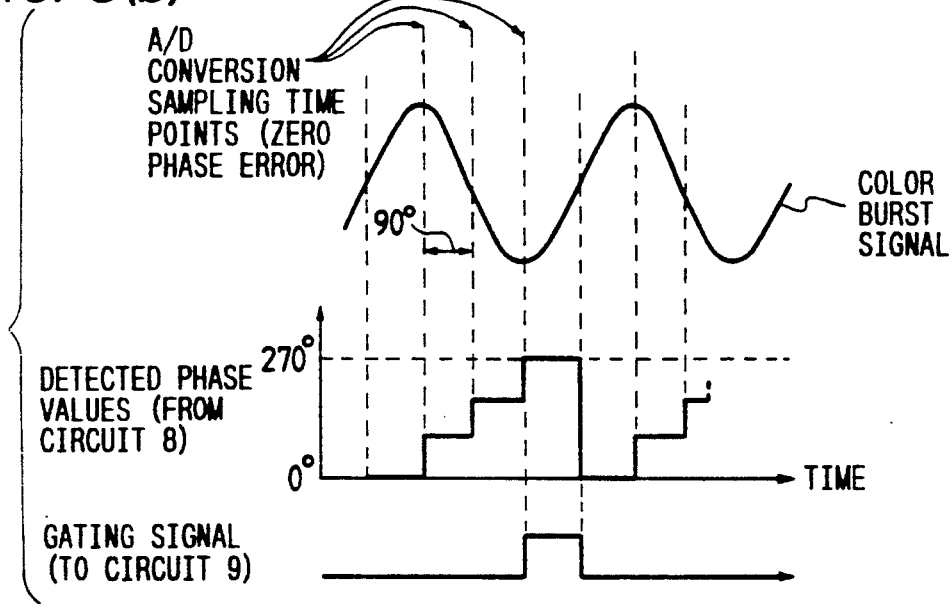
Figure 5C:
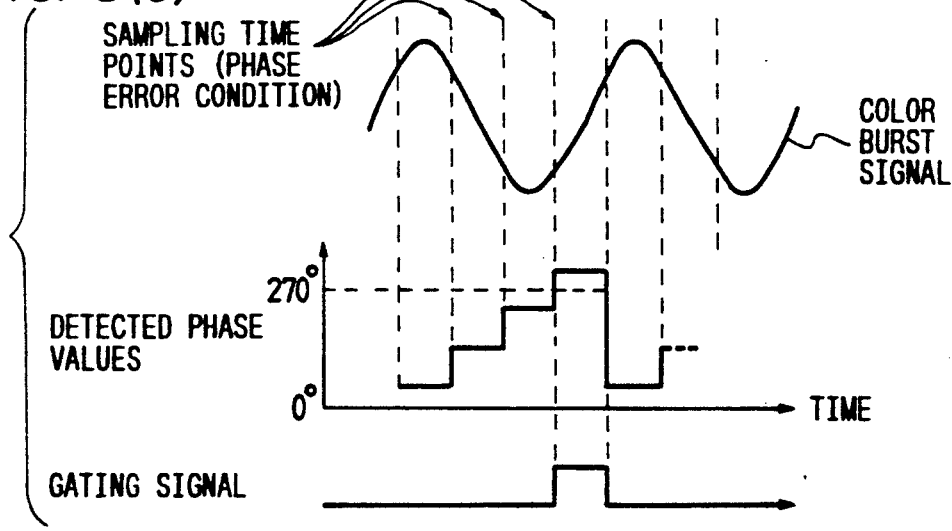

That operation is illustrated in the timing diagrams of FIG. 5. As shown in diagram (a) of FIG. 5, during the horizontal blanking interval at the end of each horizontal scanning interval of the color video signal, a gating signal is generated (by the gating signal generating circuit 21) after a certain interval $t_g$ has elapsed following the leading edge of the horizontal synchronizing pulse. Diagram (b) of FIG. 5 shows the timing relationships between the color burst signal, the detected phase values that are produced from the gate circuit 9, and that gating signal 9. For simplicity of description, all signals are shown in analog form. Assuming for example that a numeric value representing a phase value of 270° has been set into the phase value setting circuit 12, then diagram (b) corresponds to the condition of zero phase error of the sampling clock signal, since a detected phase value of 270° is outputted from the color burst signal phase detection circuit s when the gating signal occurs.

Diagram (c) illustrates a case in which there is a phase error of the sampling clock signal. The sampling timing which should occur precisely at the 270° phase angle of the color burst signal is delayed, so that when the gating signal occurs, a detected phase value that is greater than 270° is being outputted from the color burst signal phase detection circuit 8, and a corresponding phase difference will be produced from the subtractor 11 and supplied to the numerical control oscillator 13. However due to the fact that the timing of the gating signal (produced from the gating signal generating circuit 21) is determined by counting sampling clock signal periods following a predetermined reference time point (the rising edge of the horizontal synchronizing signal pulse), the gating signal will be delayed by the same amount as the aforementioned sampling time point, and so will occur at the correct time for selecting the specific detected phase value that corresponds to that particular sampling time point.

It can be understood that although it would be possible generate each gating signal after a fixed amount of delay following a reference time point such as the leading edge of the horizontal synchronizing pulse, in each horizontal scanning interval, rather than by determining that delay amount by counting a fixed number of sampling clock signal periods, that would result in the permissible range of phase error of the sampling clock signal becoming small.

Figure 6A:
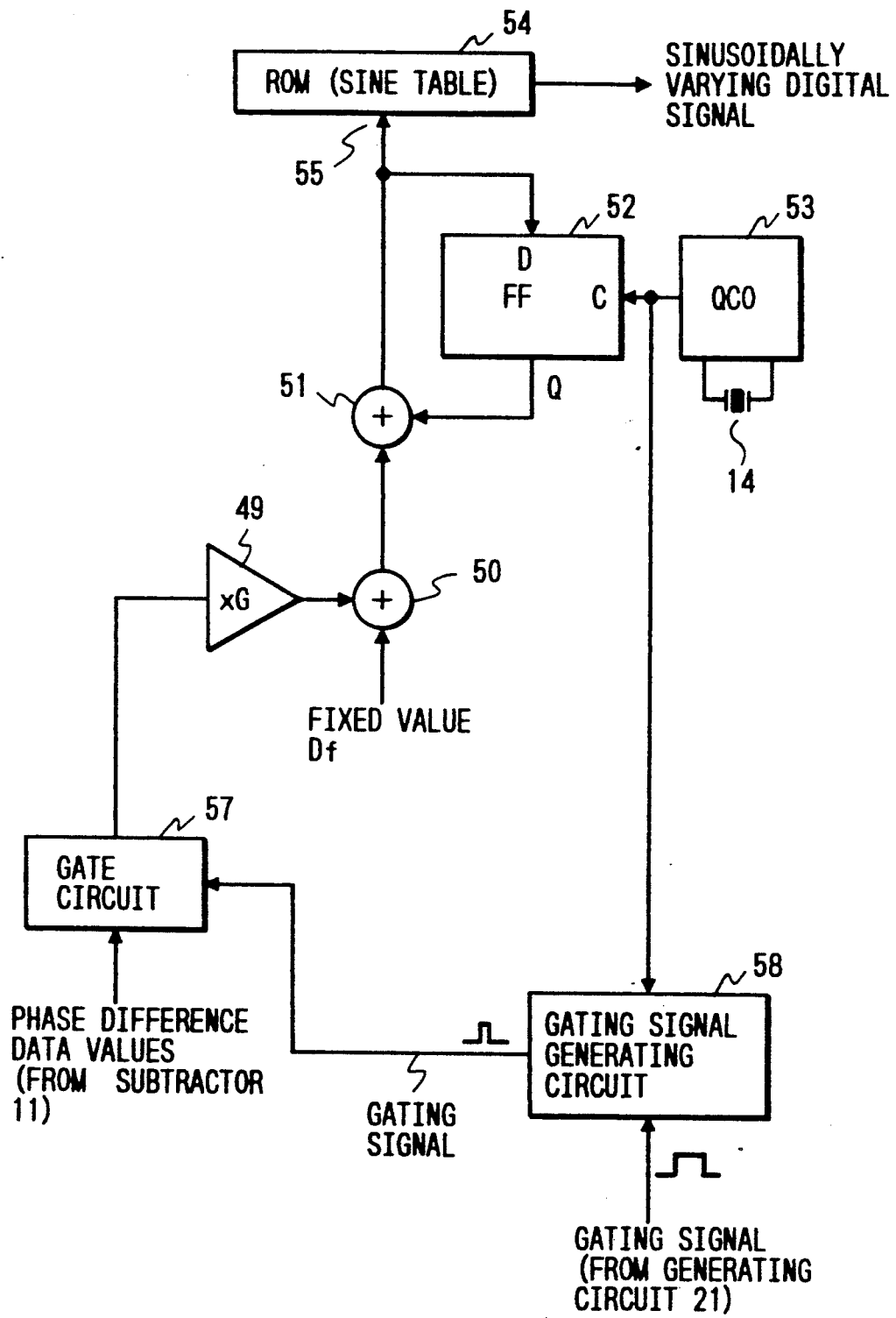
FIGS. 6A and 6B are circuit block diagrams of respective examples of a configuration of a numerical control oscillator used in the embodiment of FIG. 4.

FIG. 6A shows an example of a specific configuration for the numerical control oscillator 13, which is basically of a form that is known in the prior art, and is sometimes referred to as a digital VCO. The frequency of the digital output signal produced from the numerical control oscillator 13 is determined by a digital integrator circuit that is formed of a delay element and an adder. For simplicity, only the adder 51 and delay element for one data bit are shown, the latter being formed of a data type flip-flop 52 supplied with a fixed-frequency clock signal from a quartz crystal controlled oscillator 53. The adder 51 adds together the output data value from the FF 52 and supply the resultant value to the data input terminal of the FF 52. The integrator circuit thereby generates successive data values which are supplied as address values to a ROM 54. The ROM 54 has stored therein a table of data values which successive vary in amplitude sinusoidally, and these are read out in response to successive address values applied to the address input terminals 55. Assuming for example that a 10-bit word length is used, then the maximum address value will be 1023, so that when a data value is supplied to the adder 51 of the integrator circuit, the address values will periodically linearly increase until the maximum value is exceeded, then return to an address close to zero. Output digital data values are thereby produced from the ROM 55 which periodically vary sinusoidally in magnitude at a frequency which is determined by the aforementioned input data supplied to the adder 51. That data value is produced from an adder 50, having one input terminal to which is applied a fixed data value $D_f$ which establishes the frequency of the output signal from the ROM 55 when no input is applied to the other input of the adder 50. More specifically, in that condition the frequency of the output digital signal from the ROM 55 is determined by the frequency of the clock signal that is supplied to the flip-flop 52 from the VCO 53, in conjunction with the fixed data value $D_f$.

The gating signal that is produced from the gating signal generating circuit 21 is applied to a gating signal generating circuit 58, together with the high frequncy clock signal which is produced from the QCO 53, for deriving a gating signal (e.g. occurring during one period of that high frequency clock signal) which is supplied to a gate circuit 57, to transfer each of the successive phase difference values from the subtractor 11 through the gate circuit 57. The difference value is then amplified, i.e. multiplied by a fixed factor G, before being added to the fixed value $D_f$ in the adder 50.

In that way, each phase difference value that is supplied to the circuit of FIG. 6A, i.e. each phase errror value, results in an instantaneous change in phase of the digital output signal from the ROM 54, with such a change in phase occurring only once in each horizontal scanning interval, and with the direction of change being such as to reduce the amount of phase error.

Figure 6B:
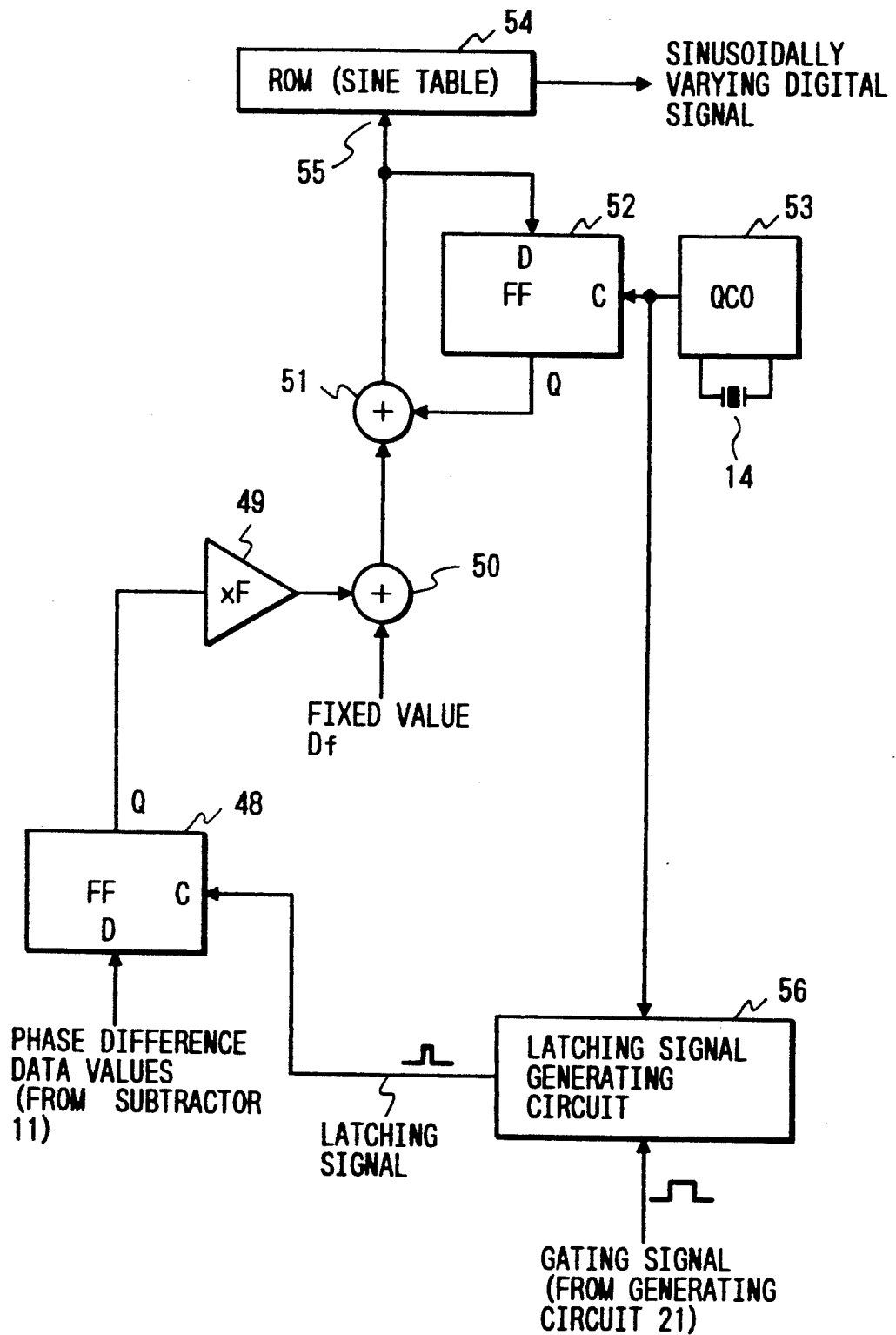

An alternative circuit for the NCO is shown in FIG. 6B. This is similar to the circuit of FIG. 6A, and differs only in that each phase difference value is set into a latch circuit (with one element of that circuit, for one data bit, being shown as a data-type flip-flop 48), in response to a latching signal that is generated at a time point during each latching signal produced from the generating circuit 21. Thereafter, during the succeeding horizontal scanning interval, that phase difference value is fixedly added to the fixed value $D_f$ in the adder 50, after having been amplified by a fixed factor F. The frequency of output signal from the ROM 54 during that horizontal scanning interval is thereby changed slightly from that of the preceding scanning interval, in a direction such as to reduce that phase difference value.

In each of the circuit of FIGS. 6A, 6B, the effective value of loop gain of the negative feedback loop containing the NCO can be set as required by suitably selecting the degree of amplification provided by the factor multiplier 49.

The resolution of the output signal from the ROM 54 is determined by the frequency of the clock signal produced from the QCO 53, which is set by the vibrator element 14. It is not practicable to utilize the output signal produced from the numerical control oscillator 13 directly (after D/A conversion) as the sampling clock signal, since achieving a satisfactory degree of resolution for the output signal from the numerical control oscillator 13 would require an impossibly high value of frequency for the clock signal which controls the delay element (flip-flop) of the digital integrator circuit. In general, the frequency of the clock signal produced from the QCO 53 should be at least 360 times that of the digital periodic output signal produced from the ROM 54. Thus, assuming that the frequency of the sampling clock signal is four times that of the chrominance subcarrier, then a frequency of approximately 5.15 GHz would have to be produced by the QCO 53 with a high degree of stability of phase, which is not practicable.

It would of course be possible to use other types of circuit configuration for the numerical control oscillator 13, and those of FIGS. 6A, 6B are shown only by way of example.

An example of such a numerical control oscillator producing a periodically varying digital output signal is described in the Jul., 1988 edition of the magazine "Electronics" published in Japan. That oscillator is applied as a frequency modulator.

Figure 7:
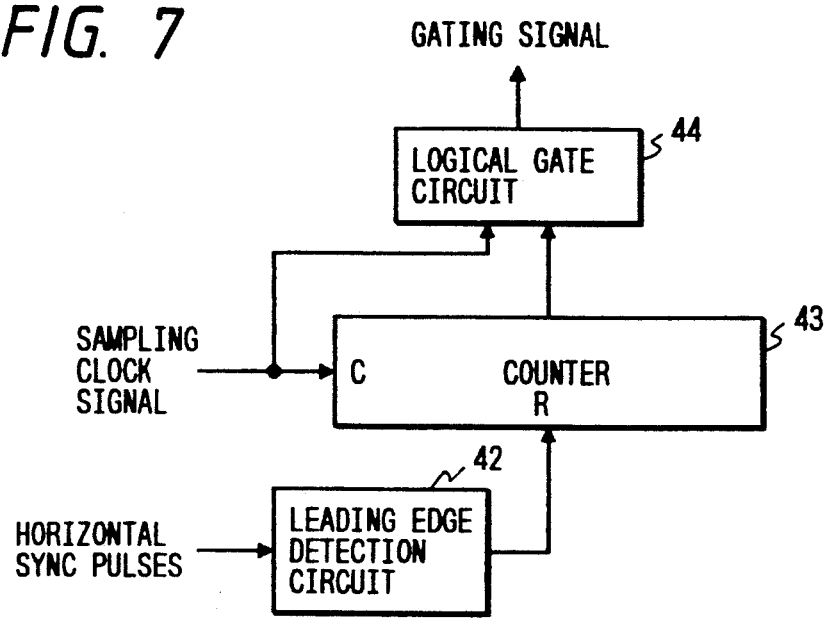
FIG. 7 is a circuit block diagram of a gating signal generating circuit in the embodiment of FIG. 4.

FIG. 7 shows a basic circuit block diagram of a specific configuration for the gating signal generating circuit 21 of this embodiment. A leading edge detection circuit 42 produces an output signal at the start of each horizontal synchronizing pulse, which resets a counter 43. Successive periods of the sampling clock signal are counted by the counter 43, whose output count value is inputted together with the sampling clock signal to a logical gate circuit 44, from which a gating signal is produced when the delay interval $t_g$ shown in diagram (a) of FIG. 5 has elapsed.

Figure 8:
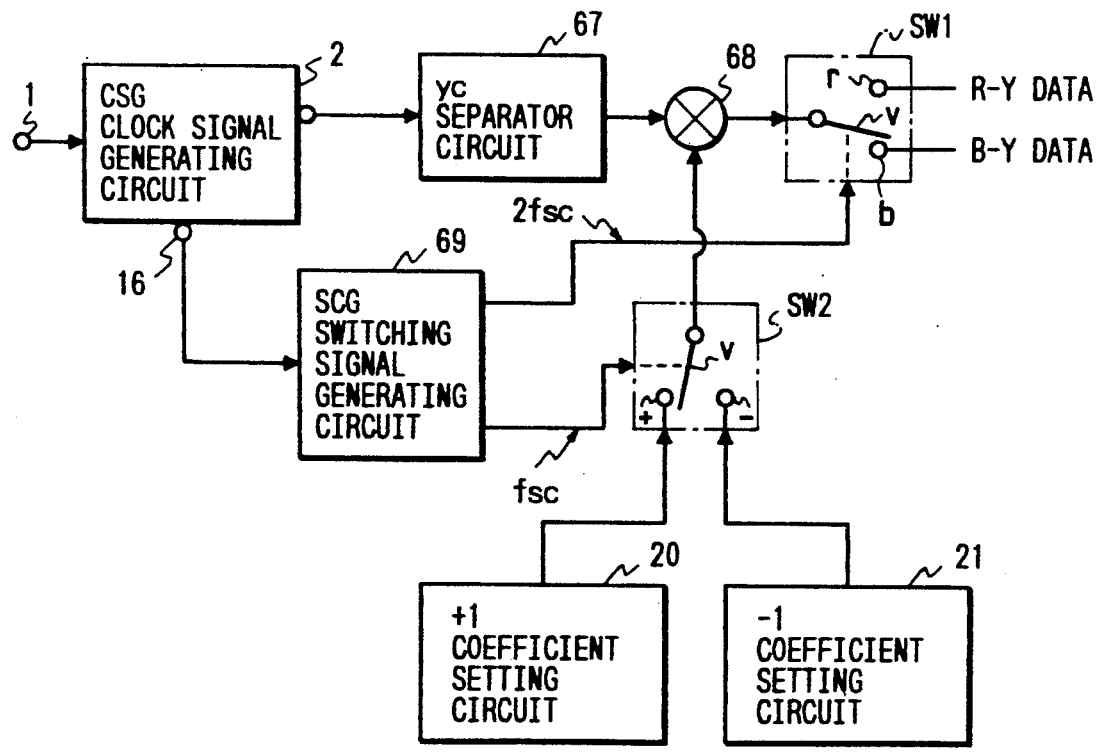
FIG. 8 is a circuit block diagram of an example of a color demodulator circuit to which a circuit according to the present invention for generating a clock signal which is locked to a specific phase of a color burst signal is applicable.

FIG. 8 shows the configuration of a an example of a hiygh-accuracy color demodulator circuit which uses the clock signal generating circuit CSG of FIG. 4. In FIG. 8, 67 denotes a YC separator circuit, 18 denotes a multiplier, 69 denotes a switching signal generating circuit, 20 and 21 are function setting circuits, SW1 and SW2 are changeover switches.

In the color demodulator circuit of FIG. 2, the color video signal digital data that are outputted from they output terminal 2 of the clock signal generating circuit CSG are supplied to the YC separator circuit 67, in which the luminance and chrominance components are separated, with the separated chrominance signal being supplied to the multiplier 68. The sampling clock signal, e.g. having a frequency of 4 $f_{SC}$, is outputted from the output terminal 16 of the CSG and is frequency divided in the switching signal generating circuit 69 to obtain a switching signal having a frequency of 2 $f_{SC}$ and a switching signal having a frequency of $f_{SC}$. The switching signal with a frequency of 2 $f_{SC}$ is supplied to control the operation of the switch SW 1 while the switching signal with a frequency of $f_{SC}$ is supplied to control the operation of the switch SW 2.

Coefficient values of +1 and −1 are supplied to the fixed contacts of the switch SW 2, so that the movable contact v of SW2 changes between being connected to +1 and −1 once in each period of the color subcarrier. The coefficients +1 and −1 that are set by the setting circuits 20 and 21 are thus alternately supplied to the multiplier 68 as the multiplier input signal.

The switch SW 1 has a movable contact v which receives the output signal from the multiplier 68, and transfers to a fixed contact r the R-Y signal data and transfers to a fixed contact b the B-Y signal data, with changeover between the r and b contacts occurring once in each half-period of the color subcarrier.

With the color demodulator circuit of FIG. 2, a highly accurate demodulated clock signal will always be obtained, so that it becomes unnecessary to executed color phase adjustment. If it is required to deliberately alter the color phase, that can be done by modifying the phase data value that is set in the phase data setting section 12, within the CSG.

Figure 9:
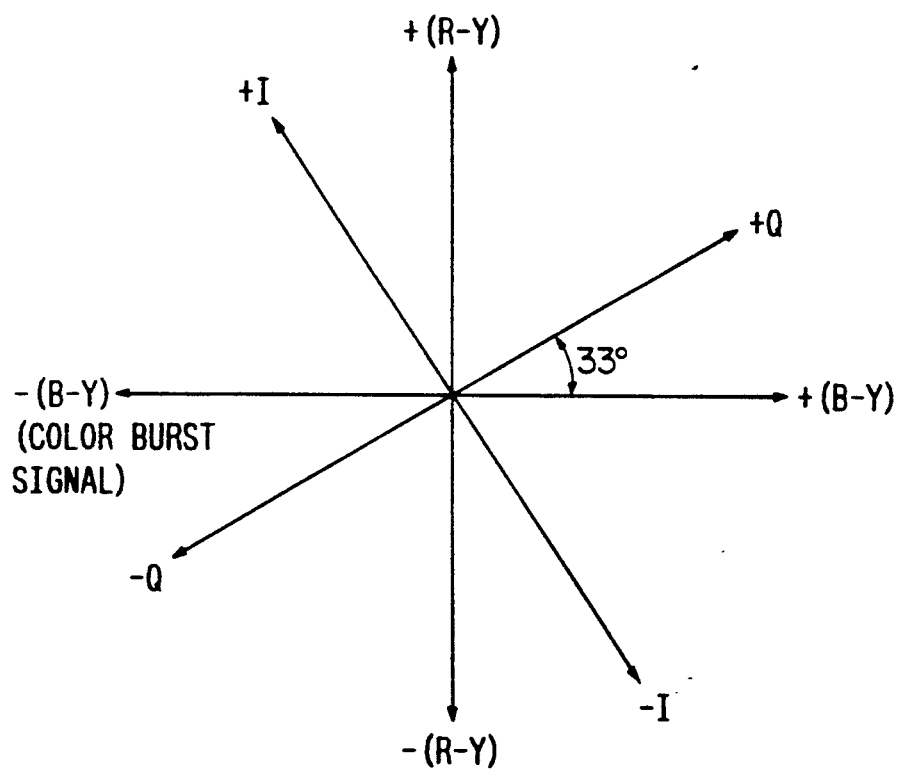
FIG. 9 is a diagram showing the phase angle relationships between amplitude modulation components of a chrominance signal in a color video signal.

In the above description it is assumed that the frequency of the sampling clock signal is four times that of the chrominance subcarrier, and that the sampling time points determined by the sampling clock syignal are locked to the 0°, 90°, 180°, and 270° phase angles of the color burst signal, i.e. by setting one of these four values into the phase value setting circuit 12. However it is of course equally possible to lock the sampling time points to any other phase angles of the color burst signal. FIG. 9 shows the phase relationships between respective amplitude modulation components of a chrominance signal. With the D-2 format for industrial digital VTRs, the phase of the sampling clock signal is locked to the I, Q quadrature components of the chrominance signal, i.e. the sampling time points in that case would coincide with the 0°, 90°, 180° and 270° phase angles of the I component.

It should be noted that although in the circuit of FIG. 4 the synchronizing signal separator circuit 19 separates the horizontal synchronizing pulses from the analog input color video signal, it would be equally possible to use a digital synchronizing signal separator circuit to separate the horizontal synchronizing pulses, in digital form, from the output signal of the A/D converter 4.

Figure 10:
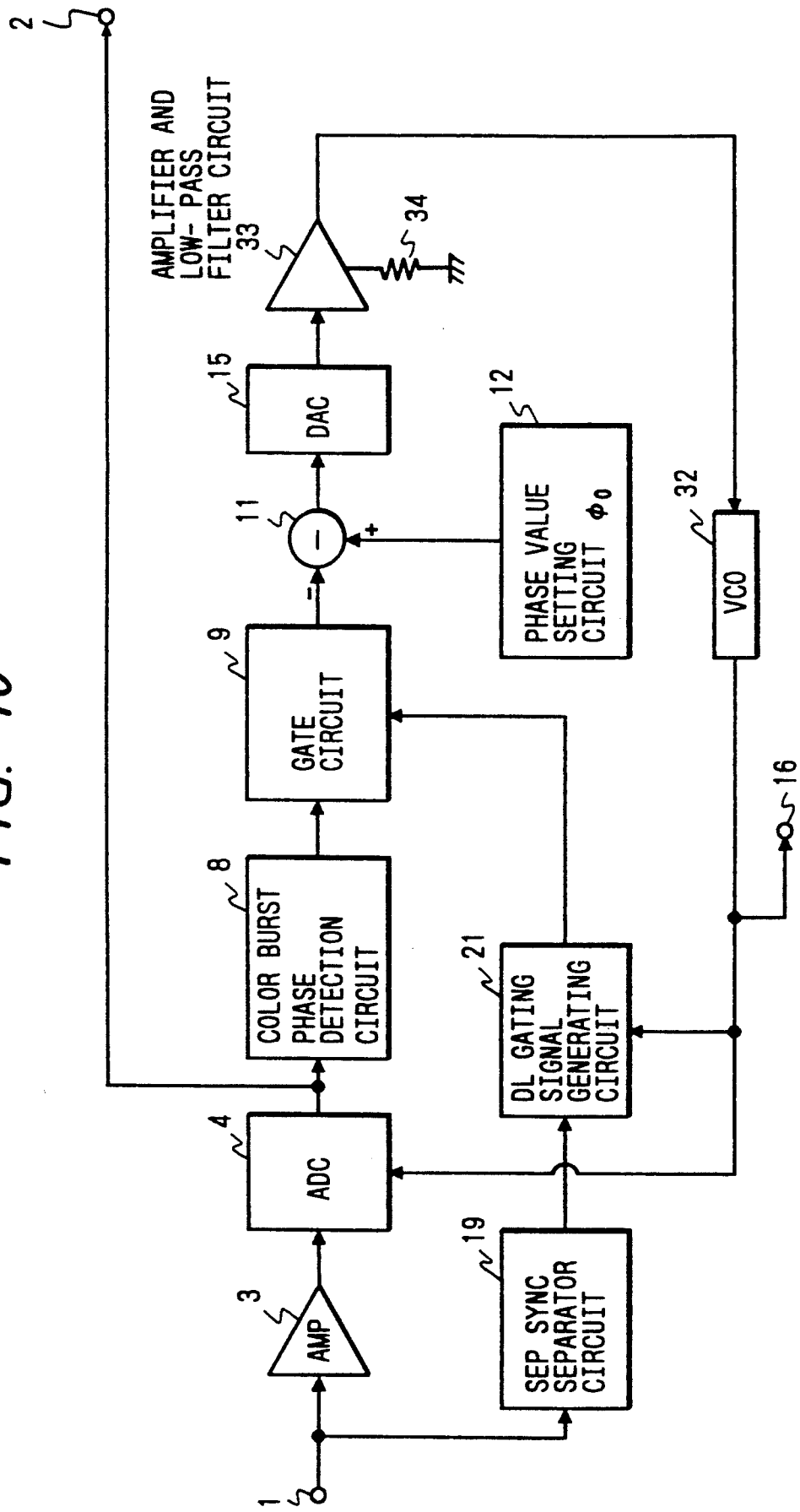
FIG. 10 is a general circuit block diagram of a second embodiment of a circuit according to the present invention for generating a clock signal which is locked to a specific phase of a color burst signal.

FIG. 10 is a general circuit block diagram of a second embodiment of a circuit according to the present invention for generating a clock signal that is locked to a specific phase of a color burst signal. In this embodiment, the sampling clock signal generating section 40 of FIG. 2 is constituted by a digital-to-analog (D/A) converter 15, an amplifier and low-pass filter circuit 33 and a VCO 32. The successive phase difference data values that are outputted from the subtractor 11 are supplied to the D/A converter 15 to be converted to corresponding analog values, which are then transferred through an amplifier and low-pass filter circuit 33. The output voltage signal that is thereby obtained from the amplifier and low-pass filter circuit 33 is supplied as a frequency control voltage to a VCO (voltage controlled oscillator) 32, to determine the phase of an output signal that is produced from the VCO 32 as the sampling clock signal, which is supplied to the A/D converter 4.

Thus with this embodiment an automatic phase control circuit is configured as a feedback loop in which the feedback path is: A/D converter 4—color burst detection circuit 8—gate circuit 9—subtractor 11—D/A converter 15—amplifier and low-pass filter circuit 16—voltage controlled oscillator 14—A/D converter 4.

Thus as for the preceding embodiment, the difference between the phase data supplied as minuend and subtrahend signal data respectively to the subtractor 11 within the feedback loop is reduced to zero. The sampling clock signal which is supplied to the A/D converter 4 is thereby locked to a phase value which has been set beforehand in the phase data setting section 12, i.e. is locked to a specific phase of the color burst signal.

The VCO 32 is a highly stable oscillator circuit producing an output signal at the frequency required for the sampling clock signal, e.g. four times the chrominance subcarrier frequency, with the phase of that output signal being adjustable in response to the voltage control signal that is supplied from the amplifier and low-pass filter circuit 33. Various circuits are known in the prior art for implementing such a voltage controlled oscillator, so that detailed description will be omitted.

With an NTSC color video signal, the phase of the color burst signal is inverted in successive horizontal scanning intervals within each field. In addition, the sequence of alternation of the color burst signal phase is different between successive fields. Specifically, of a set of four successive fields which constitute two successive frames of the video signal, the sequence of color burst signal phase alternation in the first of the four fields can be expressed as N, I, N, I, ... (where N signifies non-inverted and I signifies inverted), in the second field as I, N, I, N, ..., in the third field as N, I, N, I ... and in the fourth field as again I, N, I, N .... Such a set of four consecutive fields is sometimes referred to as a color frame. By detecting the phase of the horizontal synchronizing signal at the start of each field, a determination can be made as to whether the field is the first or second one of a frame. Thus by detecting the phase of the color burst signal at the start of each field, and using that information in conjunction with the horizontal synchronizing signal phase information, it can be determined whether the sequence of color burst signal phase alternation in successive horizontal scanning intervals of the field are of the form I, N, I, N ... or N, I, N, I, .... A circuit for executing such a determination will be referred to in the following as a color frame detection circuit.

Figure 11:
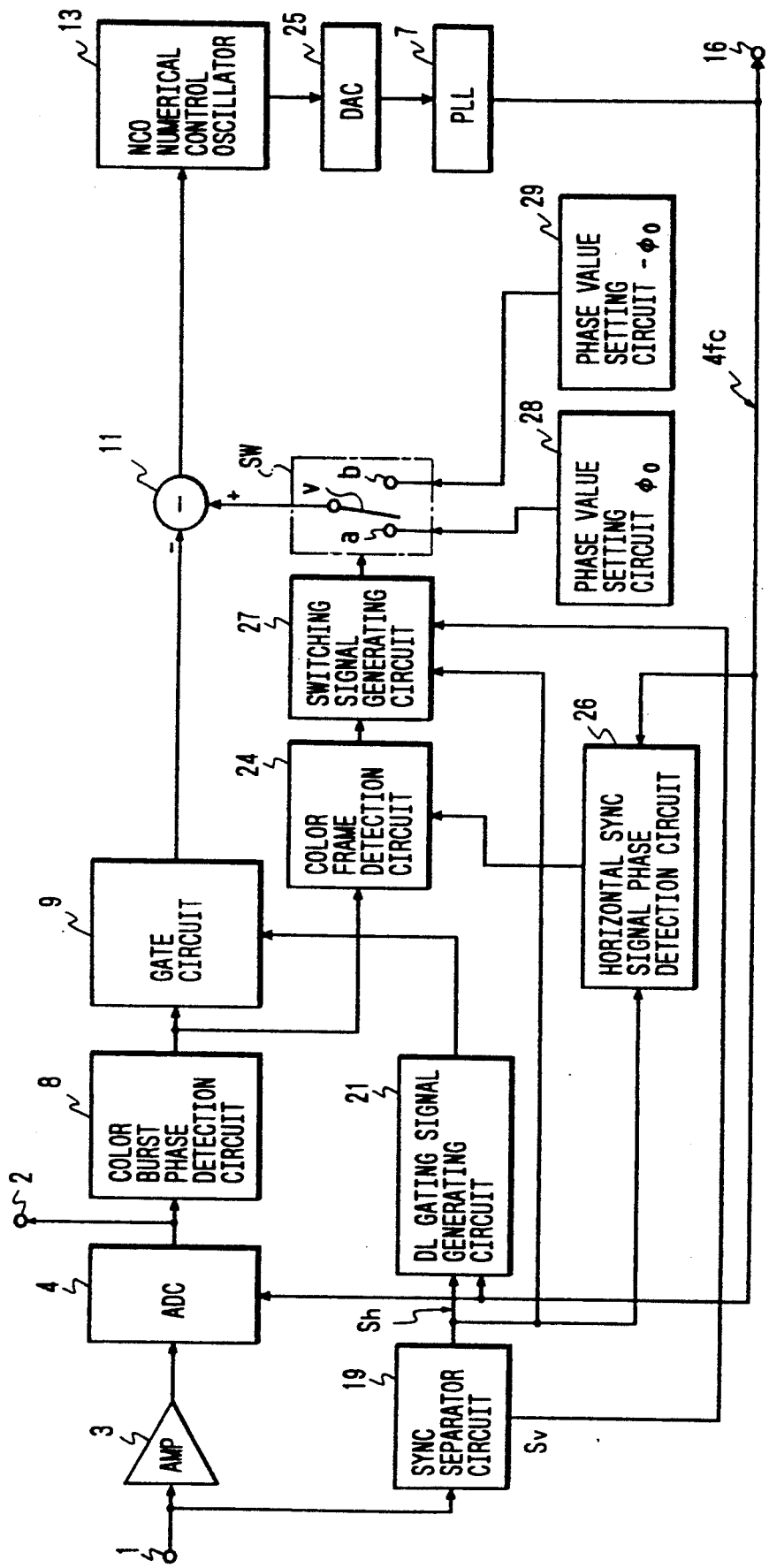
FIG. 11 is a general circuit block diagram of a third embodiment of a circuit according to the present invention for generating a clock signal which is locked to a specific phase of a color burst signal, which is applicable to a PAL standard color video signal.

FIG. 11 shows a third embodiment of the invention, which has the objective of enabling the invention to be effectively applied to such a color video signal, i.e. in which the chrominance subcarrier phase is inverted in alternate scanning lines within each field, achieves that objective That is to say, the invention enables phase information to be obtained once in each of the horizontal scanning intervals of the color video signal, in spite of the chrominance subcarrier phase alternations, so that phase lock can rapidly be achieved. In this embodiment, a negative feedback loop functioning as an automatic phase control circuit is formed by the color burst signal phase detection circuit 8, gate circuit 9, subtractor 11, numerical control oscillator 13, D/A converter 15, and PLL 7, receiving the output digital color video signal from the A/D converter 4 and supplying a phase-controlled sampling clock signal to the A/D converter 4, which is identical to the feedback loop of the embodiment of FIG. 4 described above. Further description of the operation of the feedback loop itself will therefore be omitted. However with the third embodiment, two predetermined phase values, designated as $\phi_o$ and $-\phi_o$ are set into phase value setting circuits 28 and 29 respectively, which mutually differ by 180°. A switch SW is controlled such as to select the value contained in the phase value setting circuit 28 during each horizontal scanning interval in which the phase of the color burst signal is non-inverted, and selects the value contained in the phase value setting circuit 29 during each horizontal scanning interval in which the color burst signal phase is inverted. The operation of the switch SW is controlled by switching signals produced from a switching signal generating circuit 27, which executes the appropriate changeover operation once in each horizontal scanning interval A color frame detection circuit 24 detects the start of the first field of a color frame (as defined hereinabove) and sends a corresponding indication signal to the switching signal generating circuit 27. Based on that indication, which inherently defines the sequence of color burst signal phase alternations in the four fields of that color frame, and upon the horizontal and vertical synchronizing signal signals that are supplied to it from the syhchronizing signal separator circuit 19, the switching signal generating circuit 27 generates the correct sequence of switching control signals for appropriately connecting the contents of the circuits 28 and 29 to the subtrahend data input of the subtractor 11 during the current field of the color video signal.

In that way, the phase difference data values that are outputted from the subtractor 11 will be unaffected by the phase inversions of the color burst signal in alternate horizontal scanning intervals. Otherwise, the operation of this embodiment is identical to that of the first embodiment described above.

Figure 12:
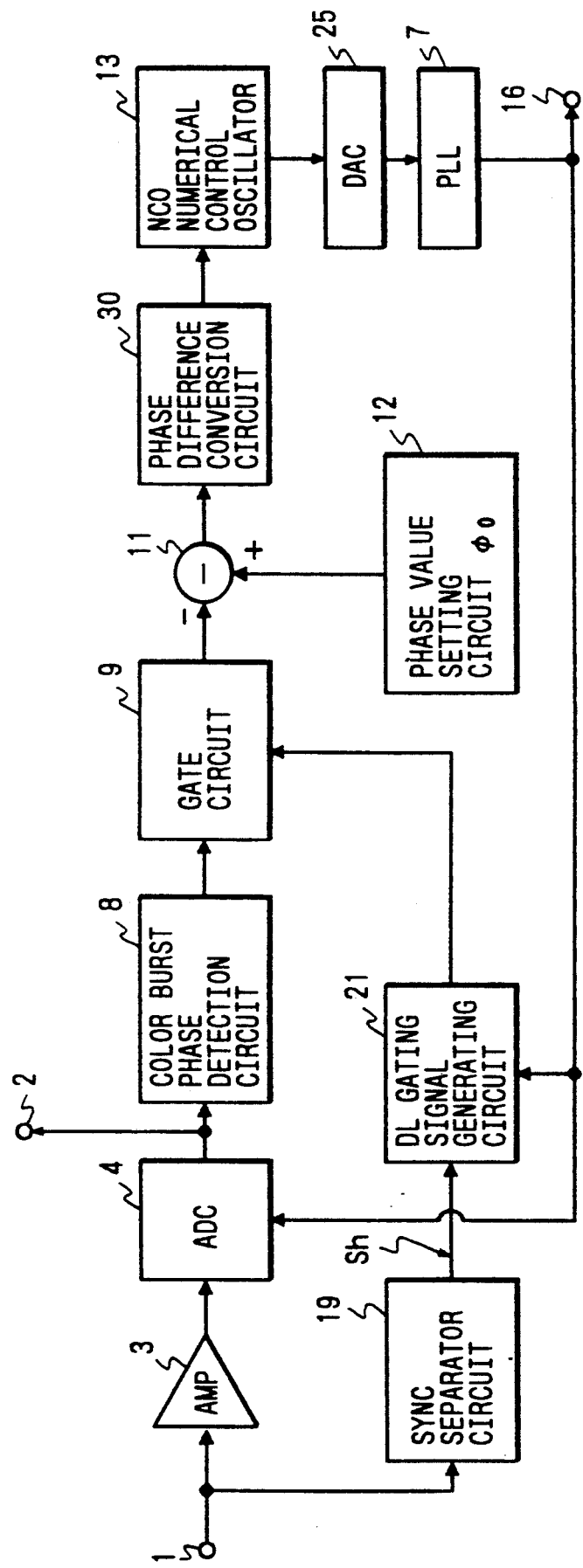
FIG. 12 is a general circuit block diagram of a fourth embodiment of a circuit according to the present invention for generating a clock signal which is locked to a specific phase of a color burst signal, which is applicable to a PAL standard color video signal.

The embodiment of FIG. 11 has the disadvantage of requiring a relatively complex circuit and a changeover switch, to eliminate the effects of alternations of color burst signal phase in successive horizontal scanning intervals of the color video signal. A fourth embodiment of a circuit according to the present invention for generating a clock signal which is locked to a specific phase of a color burst signal will be deyscribed, in which the same objective is achieved, but with a substantially simpler circuit configuration. That embodiment is shown in the general circuit block diagram of FIG. 12. That circuit differs from the first embodiment of FIG. 4 in that a phase difference conversion circuit 30 is inserted between the subtractor 11 and the numerical control oscillator 13, in the feedback loop path. The relationship between input phase difference values supplied to the phase difference conversion circuit 30 and the resultant output phase difference values is illustrated in the I/O characteristic diagram of FIG. 2A. In FIG. 2A, N= 180/n, assuming that the frequency of the sampling clock signal is n times the chrominance subcarrier frequency $f_{SC}$, where n is a positive non-zero integer as stated hereinabove. With that characteristic, the phase value at which the output from the color burst signal phase detection circuit 8 becomes locked during each field of the color video signal is expressed (in units of degrees) as:

$$\frac{360 \times k}{n} + \phi_o + 180$$

where k takes one of the values 0, 1, 2, ..., n, depending upon the position of the field within the color frame, and $\phi_o$ is the phase value that has been preset in the phase value setting circuit 12.

Figure 13A:
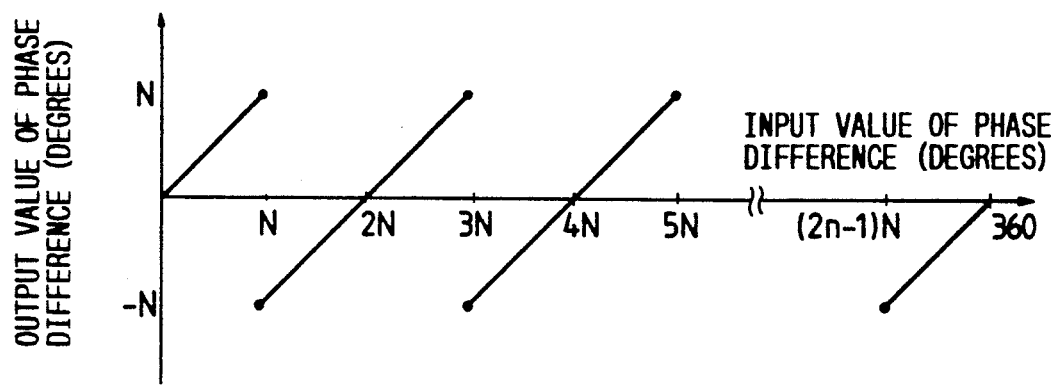
FIGS. 13A and 13B are graphs for illustrating the operation of a phase difference conversion circuit in the embodiment of FIG. 7.
Figure 13B:
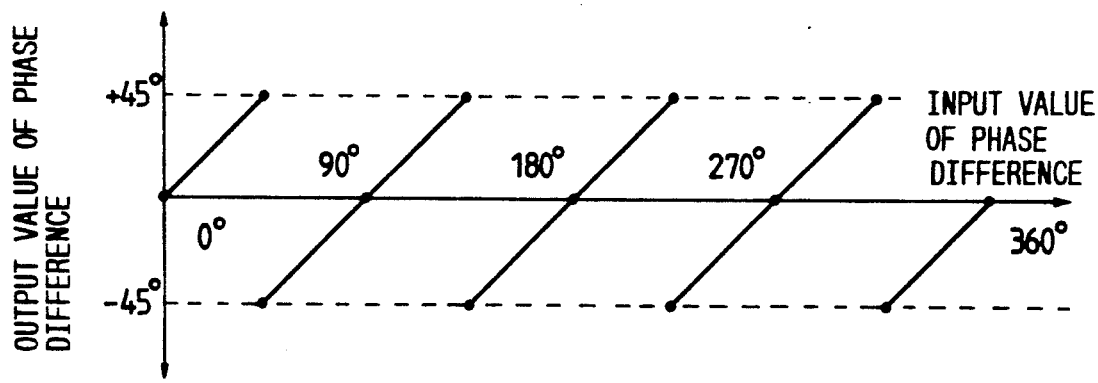

The corresponding I/O characteristic for the case in which n is equal to 4 is shown in FIG. 13B. It will be clear that during each field, if a particular value of phase difference is outputted from the subtractor 11 during one horizontal scanning interval, then when that phase difference value is changed by 180° in the next horizontal scanning interval (as a result of inversion of the phase of the color burst signal), there will be no alteration in the resultant output value produced from the phase difference conversion circuit 30. In that way the effects of color burst signal phase inversions in alternate horizontal scanning intervals is effectively eliminated, as is achieved by the embodiment of FIG. 11, but with a simpler circuit configuration.

The phase difference conversion circuit 30 can be implemented very easily, assuming for example the case in which the sampling clock signal frequency is four times the chrominance subcarrier frequency, by first converting each binary word of the phase difference data into twos-complement form, then making the bit at the MSB position identical to the bit which is at the third most significant position, and also making the bit which is at the second-most significant position identical to the bit which is at the third most significant position.

Although the phase difference conversion circuit 30 has been described in the above as being added to the embodiment of FIG. 4, it would be equally possible to insert that phase difference conversion circuit 30 between the subtractor 11 and the D/A converter 15 in the embodiment of FIG. 10. The same advantages as described above would be obtained in that case also.

It should also be noted that although the gate circuit 9 has been described as positioned between the color burst signal phase detection circuit 8 and the subtractor 11 in each of the above embodiments, it would of course be equally possible to insert the gate circuit 9 at the output of the subtractor 11.

What is claimed is:

1. A circuit for generating a sample clock signal for use in converting an analog color video signal having a color burst signal contained in a horizontal blanking interval of each horizontal scanning interval thereof to a digital color video signal, said sampling clock signal being locked to a specific phase of said color burst signal, comprising:

phase detection means (8) coupled to receive said color video signal, for producing successive data values of phase of said color burst signal in respective correspondence with periods of said sampling clock signal;

gating signal generating means (21) for generating a gating signal that is synchronized with a specific one of said phase data values, once in each of said horizontal scanning intervals;

gate circuit means (9) coupled to receive said phase data values from said phase detection means, and responsive to said gating signal for selecting and outputting said specific one of the phase data values, once in each of said horizontal scanning intervals;

phase value setting means (12) for outputting a predetermined phase data value;

subtractor means (11) for deriving successive phase difference data values, each being a difference between said predetermined phase data value and one of said selected phase data values; and sampling clock signal generating means for generating said sampling clock signal and for executing phase control of said sampling clock signal in accordance with said phase difference data values;

said sampling clock signal generating means comprising numerical control oscillator means including a fixed frequency signal source, said numerical control oscillator means operating from a clock signal produced by said fixed frequency signal source, said clock signal differing in frequency from said sampling clock signal, said numerical control oscillator means generating a periodically varying output signal which is controlled in phase in accordance with said phase difference data values; and said sampling clock signal generating circuit means further comprising phase locked loop circuit means controlled by said output signal of the numerical control oscillator circuit means, for generating said sampling clock signal.

2. A circuit for generating a sampling clock signal for use in converting an analog color video signal having a color burst signal contained in a horizontal blanking interval of each horizontal scanning interval thereof to a digital color video signal, said sampling clock signal being locked to a specific phase of said color burst signal, comprising:

phase detection means (8) coupled to receive said color video signal, for producing successive data values of phase of said color burst signal in respective correspondence with periods of said sampling clock signal;

gating signal generating means (21) for generating a gating signal that is synchronized with a specific one of said phase data values, once in each of said horizontal scanning intervals;

gate circuit means (9) coupled to receive said phase data values from said phase detection means, and responsive to said gating signal for selecting and outputting said specific one of the phase data values, once in each of said horizontal scanning intervals;

phase value setting means (12) for outputting a predetermined phase data value;

subtractor means (II) for deriving successive phase difference data values, each being a difference between said predetermined phase data value and one of said selected phase data values;

phase difference conversion circuit means (30) coupled to receive said phase difference data values produced from said subtractor means, wherein designating each of said phase difference data values produced from said subtractor means as $(\phi_o - \phi)$ where $\phi$ is a phase value produced from said phase detection circuit means and $\phi_o$ is said predetermined phase value, said phase difference data values are converted to respective output phase difference data values each of which is expressed in units of degrees as:

$$(360 k/n + \phi_o + 180) - \phi$$

where k is one of a set of positive integers 0, 1, ... n; and sampling clock signal generating means coupled to receive said output phase difference values from said phase difference conversion means, for generating said sampling clock signal and for executing phase control of said sampling clock signal in accordance with said output phase difference data values.

3. A circuit for generating a sampling clock signal according to claim 1, wherein a frequency of said sampling clock signal produced by said phase locked loop circuit means is m/n times a frequency of said output signal from said numerical control oscillator circuit means, where each of m and n is a non-zero positive integer and where m is greater than n, and wherein said frequency of the sampling clock signal is m times a chrominance subcarrier frequency of said color video signal.

* * * * *

UNITED STATES PATENT AND TRADEMARK OFFICE
CERTIFICATE OF CORRECTION

PATENT NO. : 5,243,412
DATED : September 7, 1993
INVENTOR(S) : Akira GOUKURA et al It is certified that error appears in the above-indentified patent and that said Letters Patent is hereby corrected as shown below:

On the title page, item [75], change "Hideotoshi" to --Hidetoshi--.

Signed and Sealed this

Nineteenth Day of April, 1994

Attest:

BRUCE LEHMAN

Attesting Officer     Commissioner of Patents and Trademarks